United States Patent
Lee et al.

(10) Patent No.: US 7,233,527 B2
(45) Date of Patent: Jun. 19, 2007

(54) NONVOLATILE MEMORY STRUCTURE

(75) Inventors: Chien-Hsing Lee, Hsinchu County (TW); Chin-Hsi Lin, Hsinchu (TW); Jhyy-Cheng Liou, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 11/162,730

(22) Filed: Sep. 21, 2005

(65) Prior Publication Data
US 2006/0067124 A1 Mar. 30, 2006

Related U.S. Application Data

(62) Division of application No. 10/707,665, filed on Dec. 31, 2003, now Pat. No. 7,046,549.

(51) Int. Cl.
*G11C 16/04* (2006.01)
*G11C 11/34* (2006.01)

(52) U.S. Cl. .................... 365/185.28; 365/185.08; 365/185.1

(58) Field of Classification Search ............ 365/185.28
See application file for complete search history.

(56) References Cited

U.S. PATENT DOCUMENTS

| | | | | |
|---|---|---|---|---|
| 4,870,304 | A | * | 9/1989 | Bloker et al. ............ 326/38 |
| 5,465,231 | A | * | 11/1995 | Ohsaki ............... 365/185.33 |
| 5,790,455 | A | * | 8/1998 | Caywood ............ 365/185.06 |
| 6,052,304 | A | * | 4/2000 | Chritz ................ 365/185.08 |
| 6,795,347 | B2 | * | 9/2004 | Ausserlechner et al. .............. 365/185.28 |
| 7,042,701 | B2 | * | 5/2006 | Diorio et al. ............ 361/301.4 |
| 7,071,507 | B2 | * | 7/2006 | Diorio et al. ............. 257/296 |
| 7,099,192 | B2 | * | 8/2006 | Wang et al. ............ 365/185.1 |

* cited by examiner

*Primary Examiner*—Son L. Mai
(74) *Attorney, Agent, or Firm*—Jiang Chyun IP Office

(57) ABSTRACT

The invention is directed to a layout of nonvolatile memory device. The memory cell has a gate electrode, a first doped electrode, and a second doped electrode. The first doped electrode is coupled to the bit line. The gate electrode is coupled to one separated word line. A shared coupled capacitor structure is coupled between all of memory cells of the adjacent bit lines from the second doped electrode. The capacitor structure has at least two floating-gate MOS capacitors. Each floating-gate MOS capacitor has a floating-gate transistor having a floating gate, a first S/D region and a second S/D region; and a MOS capacitor coupled to the floating gate. The first S/D region is coupled to the second doped electrode of the corresponding one of the transistor memory cells, and the second S/D region is shared with an adjacent one of the floating-gate transistor.

4 Claims, 9 Drawing Sheets

NONVOLATILE MEMORY STRUCTURE

CROSS-REFERENCE TO RELATED APPLICATION

This application is a divisional of a prior application Ser. No. 10/707,665, filed Dec. 31, 2003 now U.S. Pat. No. 7,046,549.

BACKGROUND OF THE INVENTION

1. Field of Invention

The present invention relates to Non-volatile memory structure. More particularly, the present invention relates to a non-volatile memory device with CMOS logic process.

2. Description of Related Art

Non-volatile memory has its wide applications in various field, such as the multimedia or particularly to the portable multi-media applications including digital camera and audio player, or the smart cellular phone. All of these apparatus need to store data or contents when power is off. Nonvolatile memory then has various applications.

In the various applications for integration nonvolatile memory, from fabrication and operation point of view, it is desired to adapted in the standard CMOS LOGIC process. Those applications include software updates, storing ID code, manufacture code, and look-up table. However, incompatibility process between conventional stack gate EPROM/FLASH memory and CMOS LOGIC process leads to increase process integration difficulty and cost overhead. A single-poly EPROM (erasable programmable read-only memory) cell is then proposed to prevent process incompatibility issue. As known in the current conventional technology, a memory cell has an NMOS transistor and PMOS transistor placed adjacently. The PMOS gate in N-well works as control gate and inversion layer is formed when positive voltage is applied to N-well/P+ Diffusion node. However the space-apart region of N-well capacitor and EPROM cell causes a large cell size in the conventional design.

FIG. 1A is a circuit, schematically illustrating the conventional circuit design for EPROM. In FIG. 1A, an NMOS transistor with the gate FG is forming on a p-type substrate. However, in order to have the capability to store the binary data, the PMOS transistor is formed in N-well to serve the capacitor function, wherein the gate oxide layer with the gate and the substrate form as a capacitor.

FIG. 1B is drawing, illustrating the equivalent circuit in operation for the conventional EPROM. In FIG. 1B, the MOS transistor is coupled with a capacitor at the gate electrode. The gate electrode is then coupled to the word lines W0, W1, ... Two adjacent cells has the common source region coupled to the voltage source VS, and each of the drain region is coupled to the bit line, BL0, BL1, BL2.

In the foregoing conventional design, it at least has several disadvantages. For example, the cell size is very large. This is because of device isolation limitation between P+ Diffusion in N-well to N+ Diffusion in P-well. Also and, it is not suitable for embedded Flash/EEPROM applications because the over-erase issue may be caused.

SUMMARY OF THE INVENTION

The invention provides a novel design of a nonvolatile memory device, which can at least solve the conventional drawbacks.

The invention provides a novel design of a nonvolatile memory device, which at least has the reduced cell size and has compatible fabrication process in CMOS logic process.

The invention provides a layout of nonvolatile memory device. The layout of nonvolatile memory comprises a word line and a bit line, and a plurality of metal-oxide semiconductor (MOS) transistor memory cells. Each of the memory cells has a gate electrode, a first doped electrode, and a second doped electrode, wherein each of the first doped electrode is coupled to the bit line, and each of the gate electrode is coupled to a corresponding one of the word line. A shared coupled capacitor structure is coupled between all of the transistor memory cells in the adjacent bit line from the second doped electrodes. Wherein, the shared coupled capacitor structure comprises at least two floating-gate MOS capacitors. Also, each of the floating-gate MOS capacitors comprises a floating-gate transistor having a floating gate, a first source/drain (S/D) region and a second S/D region; and a MOS capacitor coupled to the floating gate. Wherein, the first S/D region is coupled to the second doped electrode of the corresponding one of the transistor memory cells, and the second S/D region is shared with an adjacent one of the floating-gate transistor.

The invention in another embodiment also provides a nonvolatile memory cell, comprising: a metal-oxide semiconductor (MOS) transistor, having a first doped electrode coupled to a bit line, a gate electrode coupled to a word line, and a second doped electrode. Also, a floating-gate MOS transistor has a first source/drain (S/D) region coupled to the second doped electrode, a second S/D region coupled to a first voltage terminal, and a floating gate. A MOS capacitor has a gate-capacitor electrode coupled to the floating gate of the floating-gate MOS transistor, and a substrate-capacitor electrode coupled to a second voltage terminal.

The invention in another embodiment also provides a structure of a non-volatile memory cell, comprising a first transistor, having a first source/drain (S/D) electrode coupled to a bit line, a gate electrode, and a second S/D electrode; a second transistor, having a first source/drain (S/D) electrode coupled to a first voltage terminal, a gate electrode, and a second S/D electrode coupled to the second S/D electrode coupled of the first transistor. A shared capacitor structure provides two capacitors respectively coupled to the gate electrodes of the first transistor and the second transistor. Wherein, another electrode for each of the first transistor and the second transistor is coupled to a word line. Wherein the first transistor as a first cell and the second transistor as a second cell serve together as a dual-cell memory cell.

In another embodiment under the foregoing nonvolatile memory cell, a failure occurs on the dual-cell memory cell only when the first cell and the second cell are both in failure function.

The invention in another embodiment further provides a nonvolatile memory cell, used for operation of multiple-time programming, comprising a plurality of sub-memory cells grouped as a memory cell, and adapted to a bit line and a word line. Wherein, the memory cell is programmed using the sub-memory cells one after one, so that the memory cell can be programmed for multiple times.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In general, the invention at least introduce, for example, a single poly electrically programmable EPROM cell by utilizing an N-well inversion capacitor as control gate to couple program/read operation voltage to floating gate. One selected gate in series with floating gate are formed by the same poly-silicon layer to prevent over-erase issue. A new program operation condition is also proposed to prevent program disturbing issue by inserting program preset cycle. Regarding to process, the present invention of EPROM cell can be manufactured with standard CMOS Logic Process.

Figure 1A:
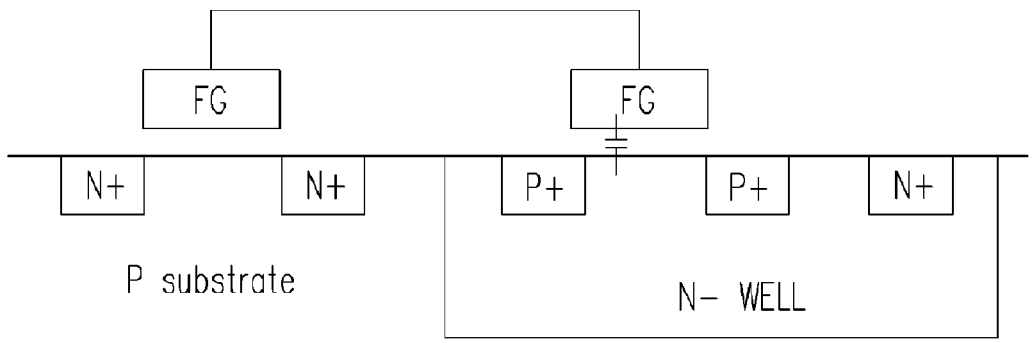
FIG. 1A is a cross-sectional drawing, schematically illustrating a conventional one of nonvolatile memory cell formed on a substrate.
Figure 1B:
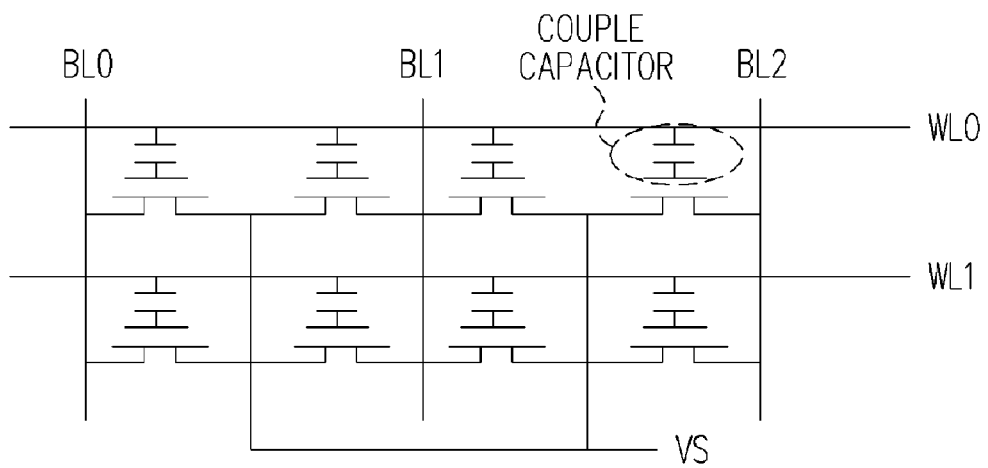
FIG. 1B is a circuit drawing, illustrating a conventional layout of memory device using the memory cell of FIG. 1A.
Figure 2:
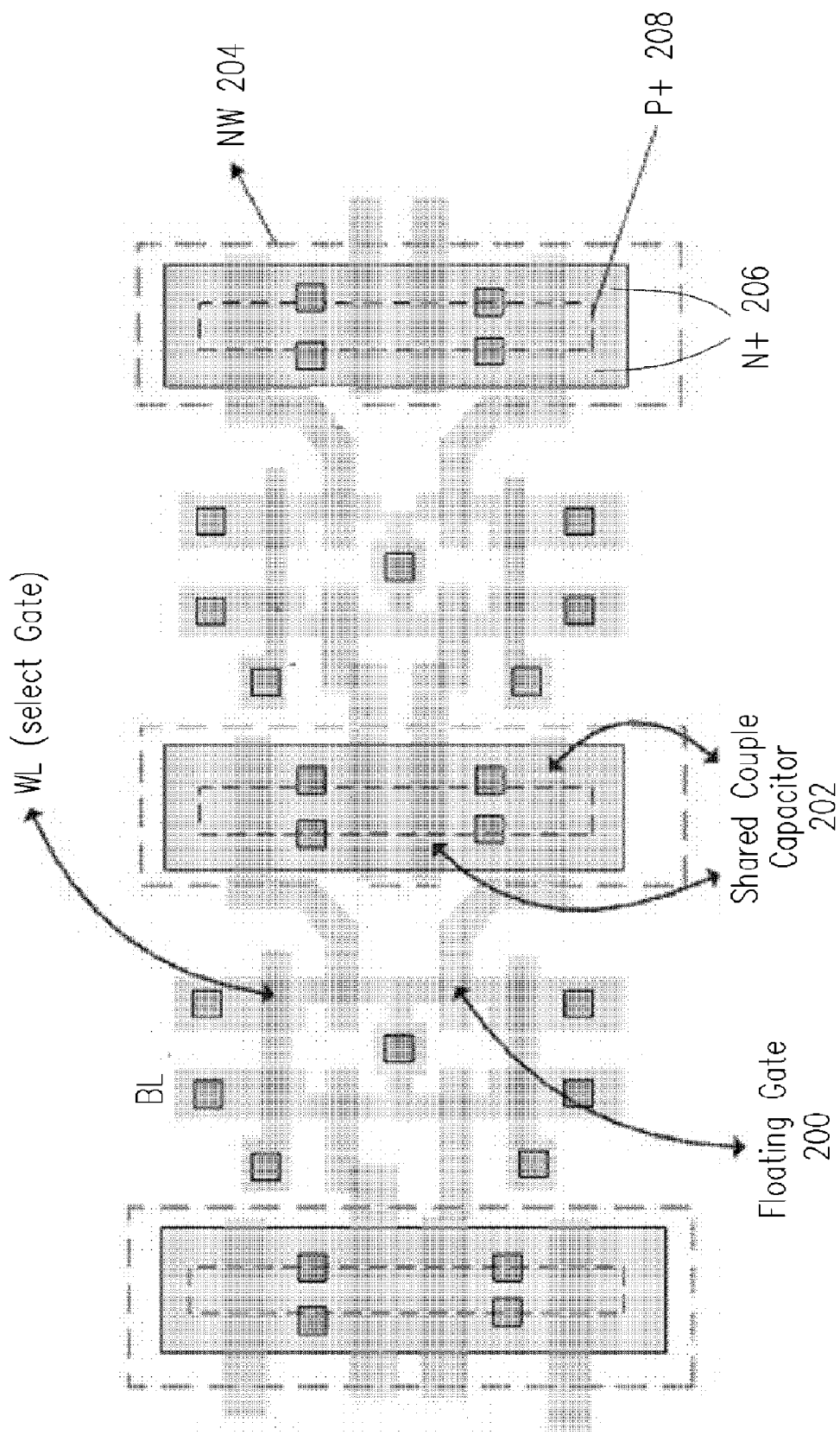
FIG. 2 is a layout, schematically illustrating a non-volatile memory device on a semiconductor substrate, according to an embodiment of the invention.

In order to reduce the cell size, a novel design of compact single-poly EPROM/EEPROM memory cell that is named as Shared Couple Capacitor Single Poly EPROM/EEPROM (SCCSP Cell as shown in FIG. 2) is proposed. In FIG. 2, two adjacent EPROM/EEPROM cells utilize the same shared couple capacitor 202 that is made of N-well capacitor with P+/N+ diffusion butting contact. P+ Diffusion in the middle of the shared capacitor provides minority carrier to form inversion layer, and N+ diffusion acts as N-well substrate pick-up and also acts as isolation for the P+ diffusion in N-well and P-well. A floating polysilicon gate 200 is formed, compatible with process of the logic gate oxide growth that is coupled to the program and read operation voltage through N-well shared couple capacitor. The same polysilicon gate also acts as a selected-gate transistor in series with floating-gate transistor to prevent over-erase issue during erase operation. The compact single-poly EPROM/EEPROM cell includes a select gate, a floating gate transistor, and a shared couple capacitor.

Figure 3A:
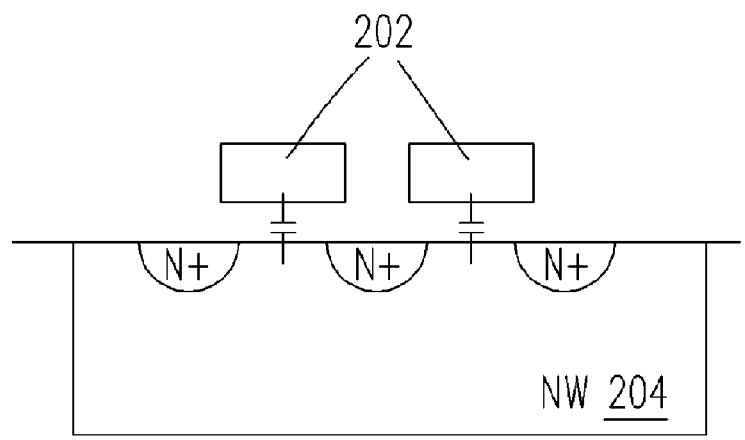
FIG. 3A–3C are cross-sectional views, schematically illustrating the shared couple capacitor structure in FIG. 2, according to an embodiment of the invention.
Figure 3B:
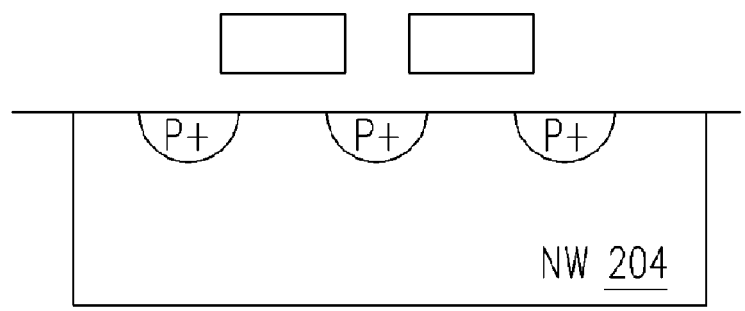
Figure 3C:
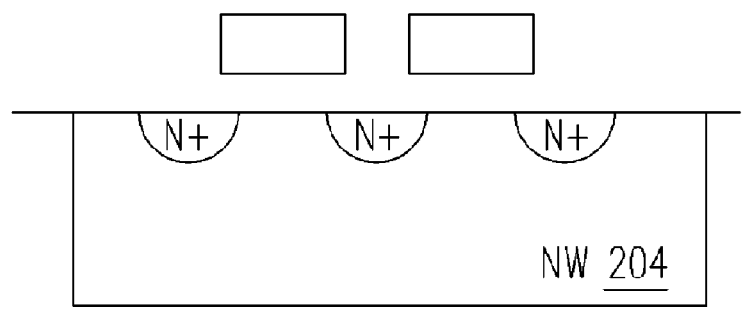

The capacitor 202 in FIG. 2 is formed by a MOS capacitor that is formed by NW inversion capacitor. FIG. 3A–3C are cross-sectional views, schematically illustrating the shared couple capacitor structure in FIG. 2, according to an embodiment of the invention. In FIG. 2 and FIGS. 3A–3C, for example, four capacitors 202 with respect four floating gates 200 are formed together in series structure within an N-type well (NW) 204. N+/NW capacitor will suffer deep depletion effect due to lack of formation of minority carrier. In order to prevent deep depletion effect, a P+ doped region 208 is formed between two of N+ doped region 206 that P+ doped will supply minority carrier to prevent NW capacitor into deep depletion region.

Figure 4:
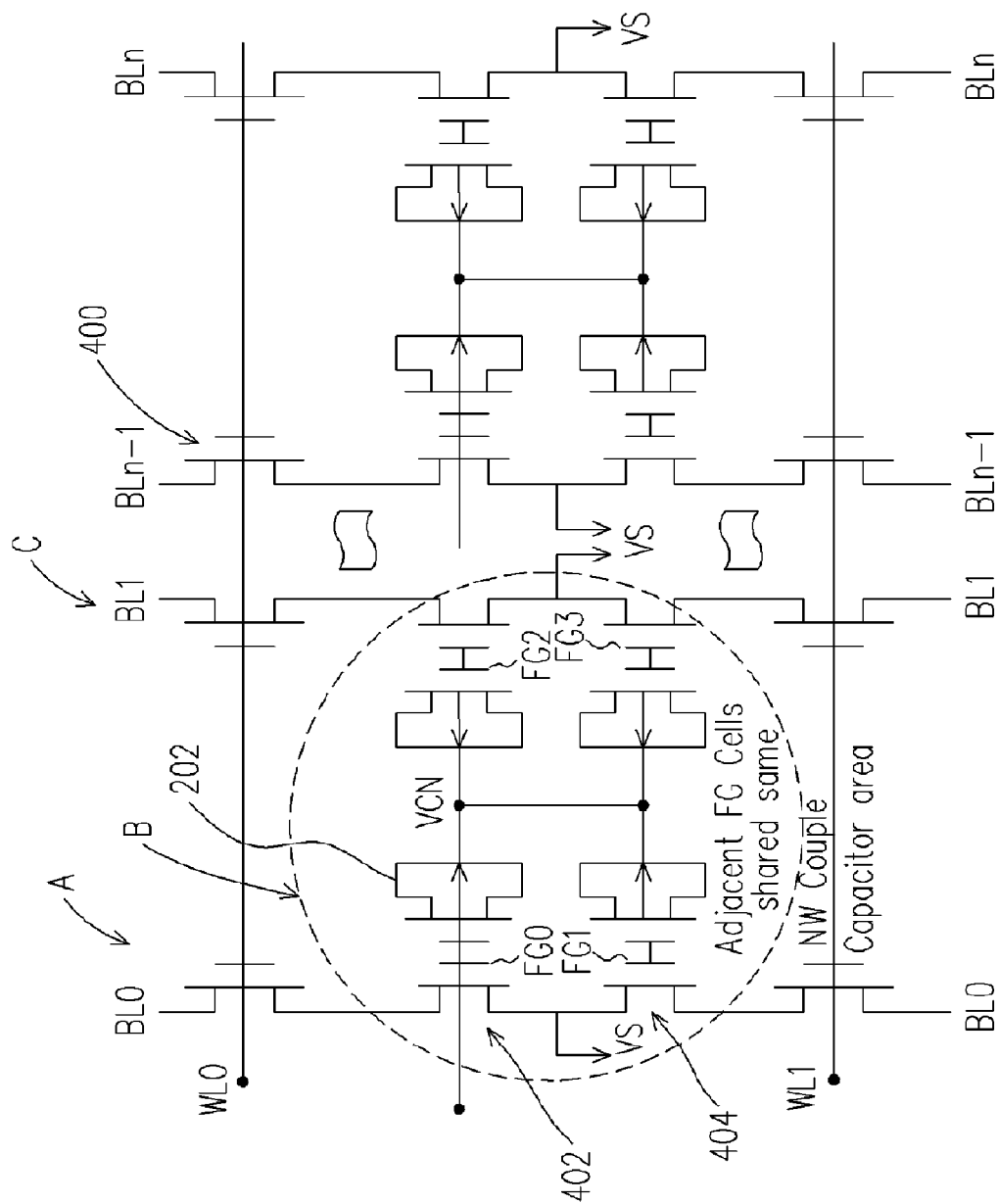
FIG. 4 is a circuit layout, schematically illustrating the non-volatile memory device with respect to FIG. 2, according to an embodiment of the invention.

FIG. 4 is a circuit layout, schematically illustrating the non-volatile memory device with respect to FIG. 2, according to an embodiment of the invention. In FIG. 4, the layout of the memory includes a plurality of MOS transistors arranged in an array structure with respect to the bit lines BL0, BL1, . . . BLn and word lines WL0, WL1, . . . . Here, only two word lines are shown. In other words, for the bit line BL0 as the example for descriptions, several MOS transistors are coupled the same bit line BL0, while the MOS transistors are respectively coupled to the corresponding word lines WL0, WL1.

The capacitor structure B is coupled between for example four MOS capacitors 202 with four floating-gate transistors 402, 404. Here, the MOS capacitor is known that a MOS device is operated as a capacitor, wherein the gate oxide layer at least servers as the capacitive dielectric layer. The principle of MOS capacitor is known by the ordinary skilled artisans, and the detailed description is skipped.

For one bit line, such as bit line BL0, two floating-gate transistors 402, 404 are formed together as charge storage node with respect to the word lines WL0 and WL1, so as to form two adjacent memory cells. In other words, the two adjacent memory cells in one bit line share the same capacitor structure. On the other hand, the same couple capacitor structure is shared by all of memory cells of adjacent bit lines BL (BL0, BL1). The capacitor structure and the circuit couple structure are shown in FIG. 5.

Figure 5:
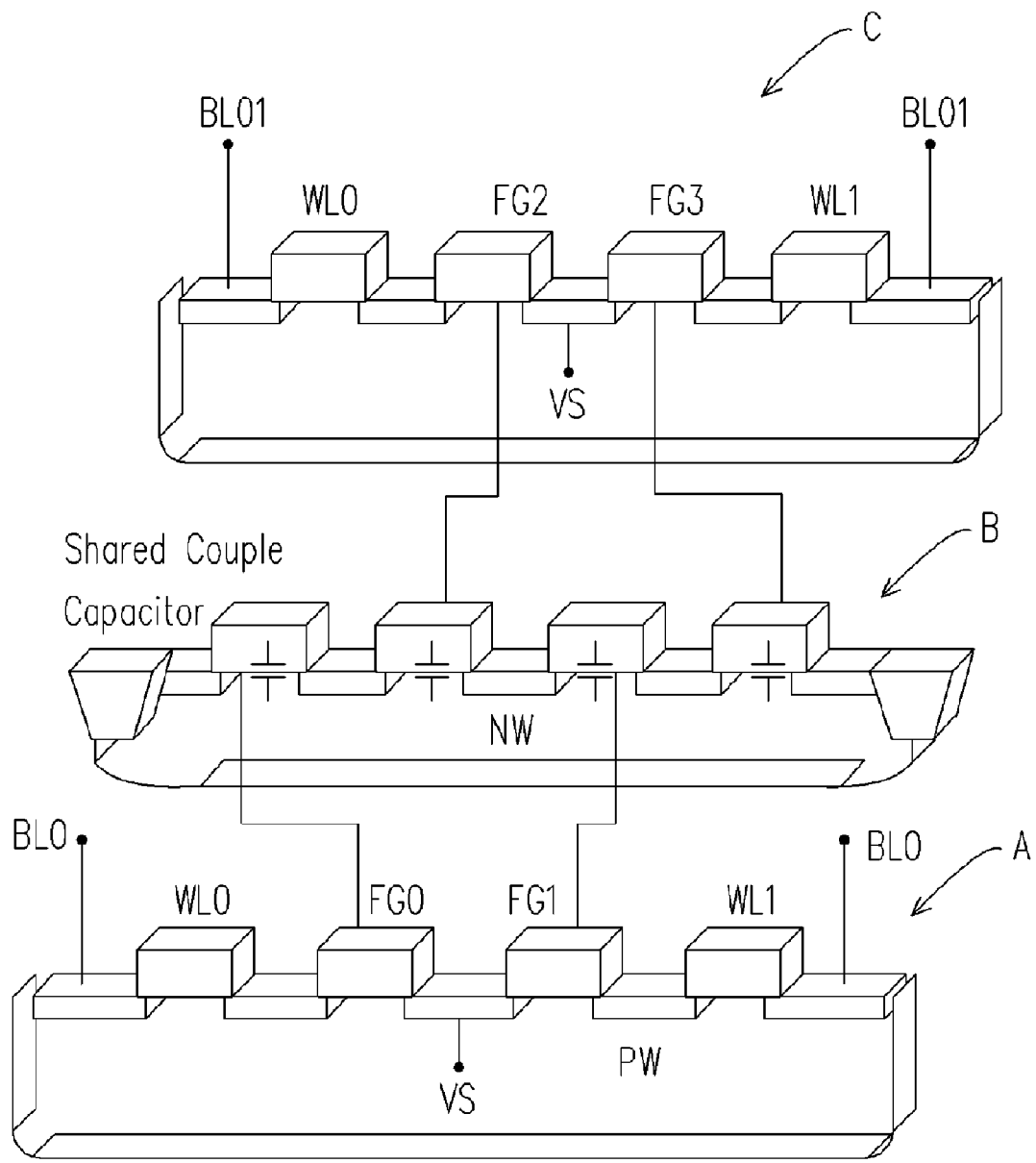
FIG. 5 is a perspective drawing, schematically the structure of the non-volatile memory device with respect to FIG. 2, according to an embodiment of the invention.

In FIGS. 4 and 5, the layout for the bit line BL0 is indicated by A part, which is shown at the bottom in FIG. 5. Likewise, the capacitor structure, indicated by B part, is shown at the middle drawing in FIG. 5, and the layout for the bit line BL1 is indicated by C part, which is shown at the top in FIG. 5.

The layout of the memory device of the invention can be seen in FIGS. 2, 4 and 5. Particularly in FIG. 5, the four MOS capacitors are formed in the same N-well (NW). And, each capacitor is coupled to one of the floating-gate transistor at one of the floating gates FG0, FG1, FG2, and FG3. The four adjacent floating-gate transistors belonging to adjacent BL (BL0, BL1) can share the same couple capacitor region. The gate electrode of the MOS transistor is coupled to the corresponding word lines WL0, WL1. The MOS transistor for example is NMOS transistor formed in a P-type substrate or P-well (PW).

As one can see, the shared capacitor structure of the invention includes several capacitor coupled in series. Since the capacitor is formed by MOS capacitor, the fabrication process is compatible with the fabrication process for the logic device. The capacitor can also be formed together to reduce the cell size. The SCCSP Cell according to the present invention comprises a select gate NMOS, a floating-gate MOS device, and a shared couple capacitor formed by N-well. The adjacent floating-gate transistor share the same NW couple gate capacitor that means the width of memory cell can reduce half of the width of couple gate capacitor.

Figure 6:
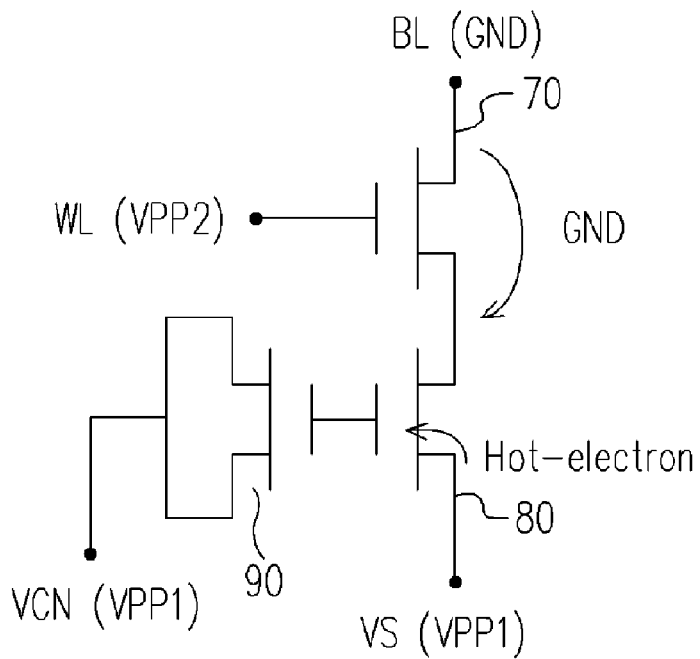
FIG. 6 is a drawing, schematically illustrating a memory cell operated in programming, according to an embodiment of the invention.

Based on the layout of the memory device described above, several operations of programming, reading, and erasing can be performed by applying a proper voltage levels. FIG. 6 is a drawing, schematically illustrating a memory cell operated in programming, according to an embodiment of the invention. In FIG. 6, one memory cell of the invention is shown. The MOS transistor 70 of the memory cell has one doped electrode coupled to the bit line BL, the gate electrode coupled to the word line WL, and the other doped electrode coupled to the floating-gate transistor 80 at one S/D region. The floating-gate transistor 80 has another S/D region serving as a first voltage terminal indicated by VS, and a gate electrode coupled to on end of the MOS capacitor at the gate. Another capacitor electrode, that is a substrate electrode, of the MOS transistor serves as a second voltage terminal indicated by VCN.

In FIG. 6, a programming operation is described. The first voltage terminal VS (source electrode) and the second voltage terminal VCN are pulled up to a voltage level of VPP1 (typical value is for example 3–7 V), and word line for selecting gate of the programmed cell is applied to a voltage level VPP2 that should be high enough to let the BL voltage pass to drain side of program cell without voltage drop. At the same time, the bit line BL voltage of the programmed cell is held at a ground voltage (GND). The other bit lines BL's not currently selected are applied to the system voltage VCC. As a result, the voltage level existing on the floating gate is $$VFG=GCR*VPP1,$$

where GCR is the couple ratio of SCCSP and is for example larger than 80%.

Consequently, the floating gate transistor is highly conductive and high electric field occurs in the source junction, thereby electrons accelerated by the high electric field are injected from the source side N+ diffusion junction to floating gate to cause floating gate electrode negatively charged. Finally, threshold voltage of memory cell exceeds programmed verifying threshold voltage.

Figure 7:
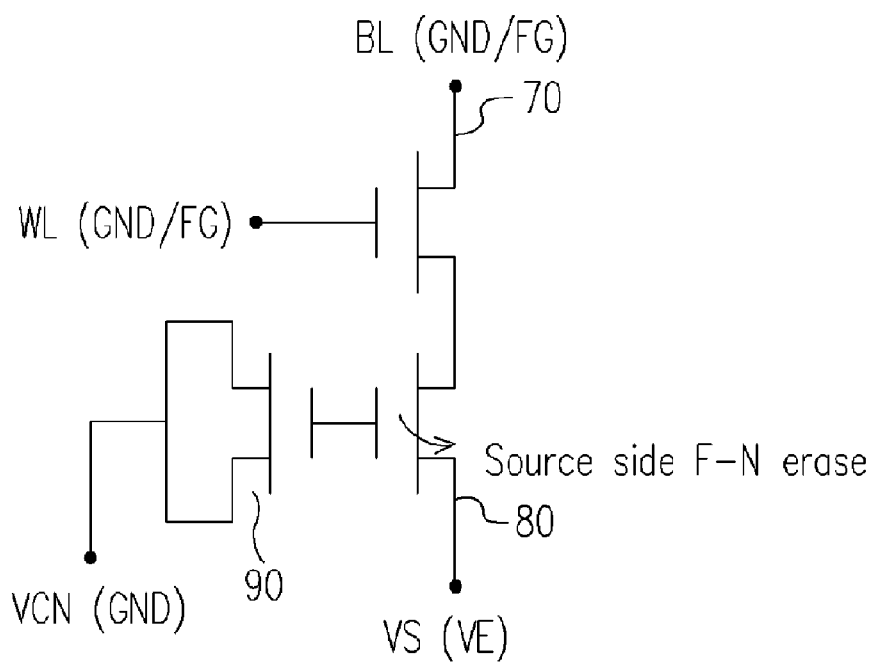
FIG. 7 is a drawing, schematically illustrating a memory cell operated in erasing, according to an embodiment of the invention.

FIG. 7 is a drawing, schematically illustrating a memory cell operated in erasing, according to an embodiment of the invention. In FIG. 7, the erasing operation is described as an example. The erasing operation is performed by F–N tunneling at the source side of floating-gate device. A high voltage VE is applied to N+ source at the first voltage terminal VS, and all of the other terminals are grounded to GND. Because of couple ratio of the memory cell is larger than 80%, high electric field existing between Floating Gate and N+ Diffusion causes F–N tunneling. The charge stored in floating gate is removed and threshold voltage of memory cell descends from program cell $V_T$ till to reach the value of erasing verify voltage. Alternative method to erase memory cell is utilizing UV erasing, in which charges stored in the floating gate are removed after 10–120 min UV light illumination.

For the read operation, the bit line BL is applied to around 1V, the world line is applied to the system voltage Vcc, the first voltage terminal as the source terminal is applied to ground voltage, and the second voltage terminal, as the substrate capacitive terminal VCN, is applied to a read voltage VR.

For the memory cell, the operation voltages are listed in Table 1 as an example.

TABLE 1

|  | VCN | WL | Selected BL | Source (VS) | Non-selected BL | Non-selected WL |
|---|---|---|---|---|---|---|
| Program | VPP1 | VPP2 | GND | VPP1 | VCC | GND |
| Read | VR | VCC | ~1 V | GND | GND | GND |
| Erase | GND | FG/GND | FG/GND | VE | FG/GND | FG/GND |

The range of various voltage levels are, for example, that VPP1 is about 3V to 7V, VPP2 is about 3V to 5V, VE is about 4V to 8V, and VR is 0V to 2V. However, the actual operation voltages may be varied. The invention provides the structure of a memory cell, which can be operated according to the actual application.

Figure 8:
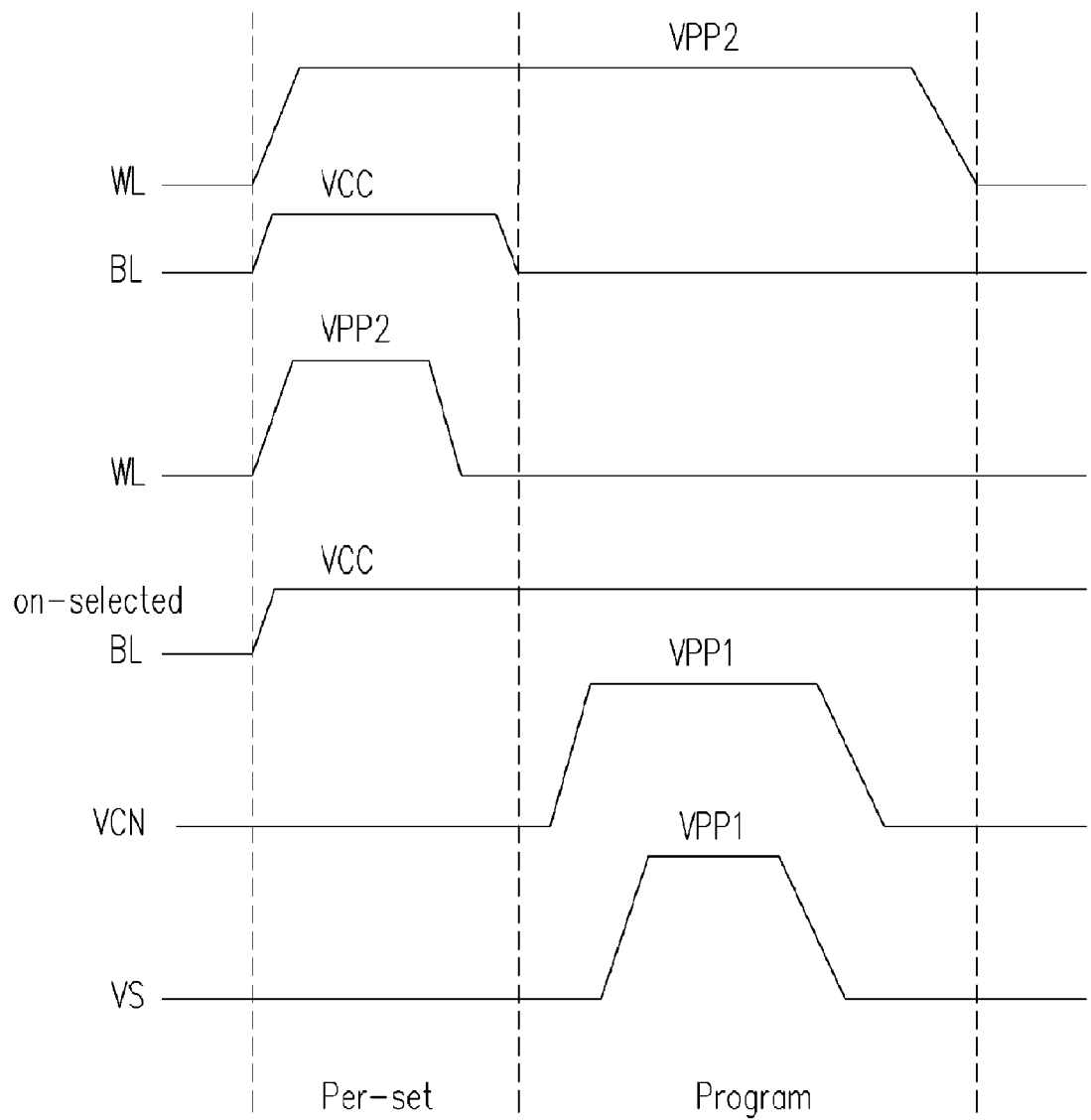
FIG. 8 is a time diagram, schematically illustrating the relation of various operation voltages in time sequence for programming, according to an embodiment of the invention.
Figure 9:
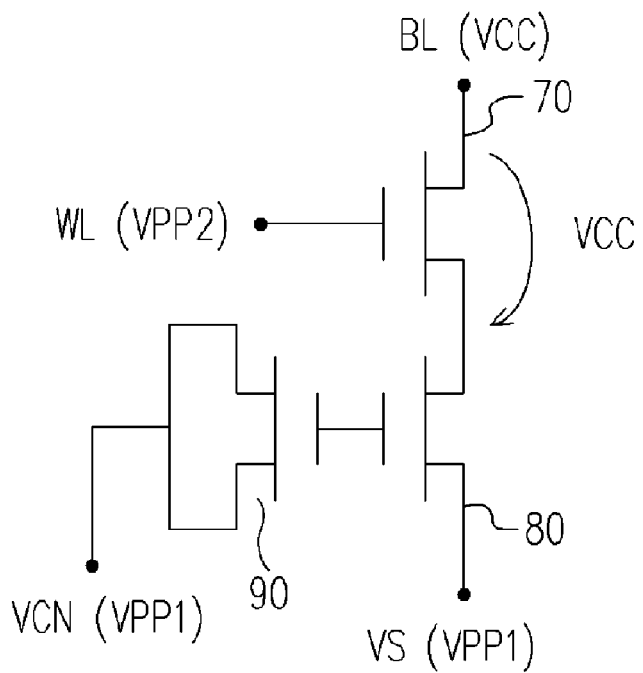
FIGS. 9–10 are drawings, schematically illustrating the prevention mechanism while a program disturbing occurs, according to an embodiment of the invention.
Figure 10:
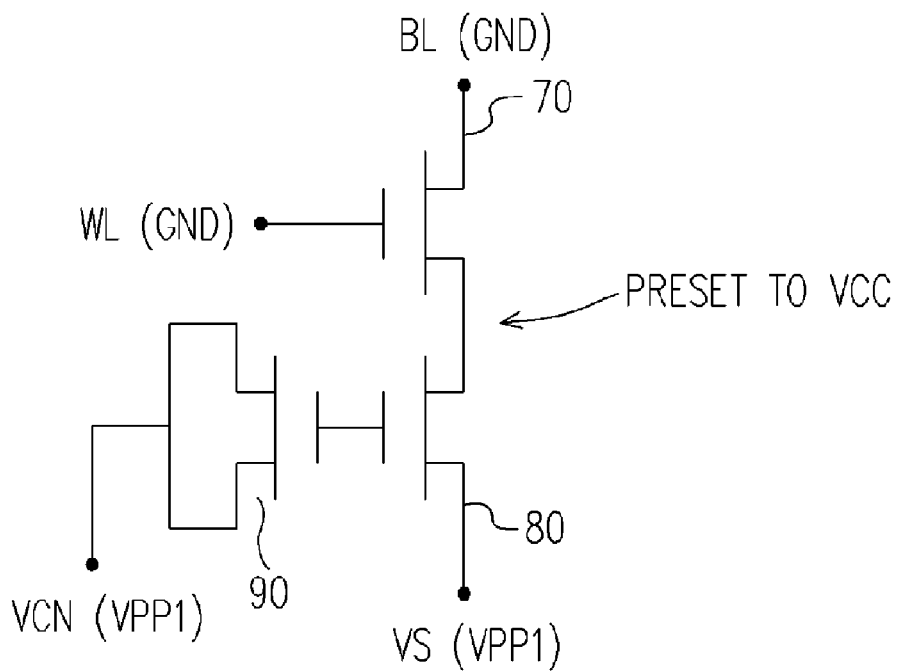

Considering program disturb issue for un-wanted programmed memory cell in the same BL with the programming cell, the invention can improve program disturbing issue by inserting preset cycle before programming cycle to preset BL voltage of unwanted cell to VCC voltage level. FIG. 8 is a time diagram, schematically illustrating the relation of various operation voltages in time sequence for programming, according to an embodiment of the invention. FIGS. 9–10 are drawings, schematically illustrating the prevention mechanism while a program disturbing occurs, according to an embodiment of the invention. In FIGS. 8–10, the preset BL voltage reduces lateral electric field of floating-gate transistor of un-wanted program cell in the same BL. The invention strongly improves the program disturbing problem.

On the other hand, considering program disturb for program inhibit cell in the same word line with programming cell. The cell can be alleviated hot carrier generation because of all of other BL are set to VCC that passes to the drain side of floating gate cell as shown in FIGS. 9–10.

Figure 11:
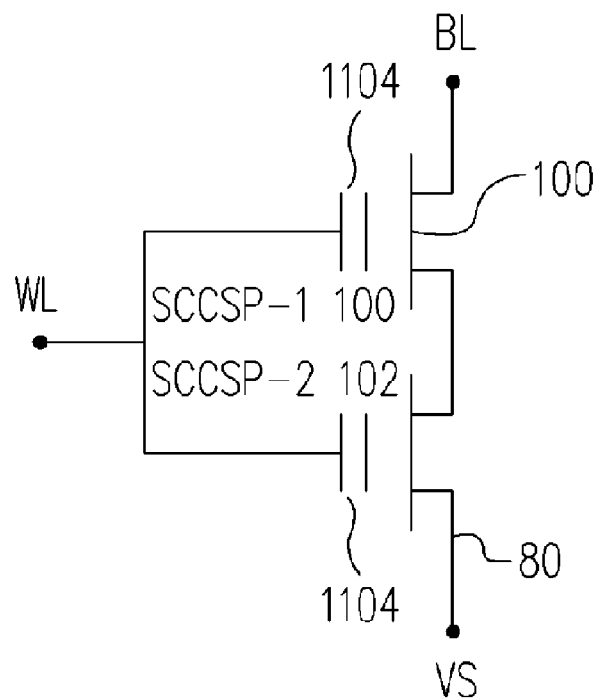
FIG. 11 is a drawing, schematically illustrating a non-volatile memory cell, according to another embodiment of the invention.

The invention also introduces another memory cell structure as shown in FIG. 11. By using the shared capacitor structure, two cells 100 and 80 can be formed together as an actual cell, wherein each cell has the capacitors 1104. However, the other capacitor electrode are coupled to the same word line. In this situation, one actual memory cell includes two sub-cells. In this situation, the probability of failure for the memory cell is effectively reduced. In other words, the lifetime can be effectively extended.

From the practical considerations, the conventional OTP, MTP and Flash memory architecture that every one of memory cells stored one data point, and memory cell should guarantee at least ten years data retention. However there are some weak bits can't pass ten years data retention criteria that may due to process contamination issue. In order to prevent this issue, the novel design can improve memory cell data retention capability. By means of at least two SCCSP cells in series (FIG. 11) to form a MEMORY CELL that can greatly improve data retention capability because of only every SCCSP cells in one MEMORY CELL fail data retention criteria represents real failure as shown in Table 2. In term of this, the probability of data retention failure is significantly reduced. Alternatively, another way is at least two SCCSP cells with combination logic to represent one data point.

TABLE 2

| Condition | SCCSP-1 | SCCSP-2 | Data retention |
|---|---|---|---|
| 1 | 0 | 0 | PASS |
| 2 | 0 | 1 | PASS |
| 3 | 1 | 0 | PASS |
| 4 | 1 | 1 | FAIL |

In Table 2, only when both SCCSP-1 and SCCSP-2 fail in data retention criteria (condition "4"), a real failure occurs. It is noted that "0" represents high $V_T$ (program) state; and "1" represents a low $V_T$ (UV) state.

The present invention also propose another memory cell structure for multiple time programming memory device. As known, the one-time programming (OTP) memory cell can be programmed one time only, and can't be applied to some of MTP (Multiple times Programming) applications. The invention proposed an extended OTP cell to perform multiple time programming.

Figure 12:
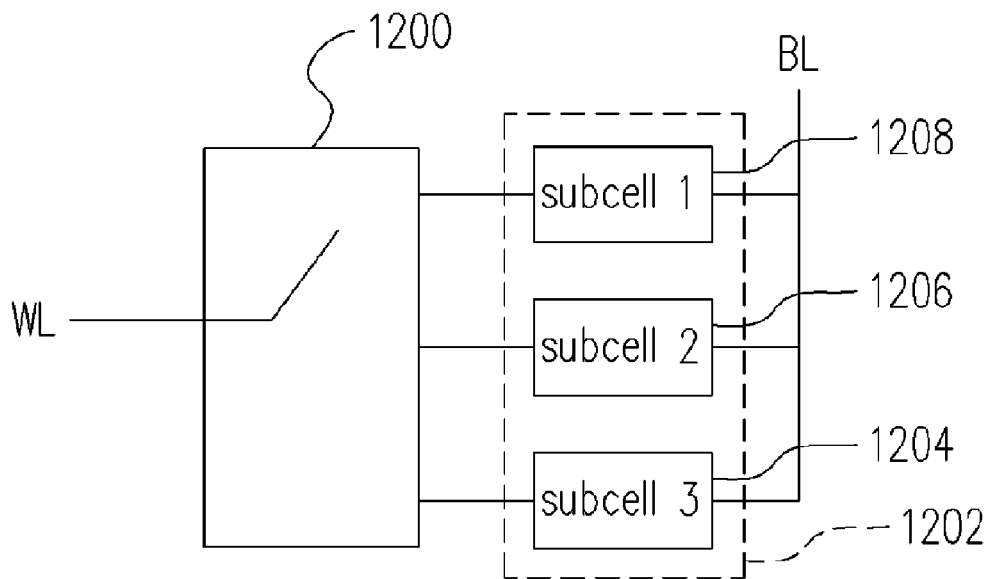
FIG. 12 is a drawing, schematically illustrating a non-volatile memory cell, according to further another embodiment of the invention.

FIG. 12 is a drawing, schematically illustrating a nonvolatile memory cell, according to further another embodiment of the invention. In FIG. 12, a memory cell includes multiple memory cells, such as the SCCSP cells which can be compactly formed with the reduced cell size. Therefore, multiple times programming operation can be achieved by programming just one SCCSP cell during each program operation. Taking three sub cells as the example. The operation is shown in Table 3.

TABLE 3

|  | SCCSP-1 | SCCSP-2 | SCCSP-3 |
|---|---|---|---|
| Initial | 1 | 1 | 1 |
| Program-first time | 1 | 1 | 0 |
| Program-second time | 1 | 0 | 0 |
| Program-third time | 0 | 0 | 0 |

In FIG. 12, one actual memory cell 1202 includes three sub memory cells 1204, 1206, 1208. The switching unit 1200 can select one of the sub cells to program or read. Therefore, according to the arrangement of three cells, the memory can be programmed three times. Alternatively, another way is separating memory array into multiple group to perform multiple times programming, only one group of memory array is selected to programming every time.

The sub memory cells basically are not necessary to be the memory cell 202 as previously described. However, in order to reduce the cell size, the memory cell with shared capacitor can allow the cell size to be reduced.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A nonvolatile memory cell, used for operation of multiple-time programming, comprising:
   a plurality of sub-memory cells grouped as a memory cell, and adapted to a bit line and a word line, wherein the memory cell is programmed by switching to the sub-memory cells one after one, so that the memory cell can be programmed for multiple times.

2. The nonvolatile memory cell of claim 1, wherein the memory cell includes a shared capacitor structure.

3. The nonvolatile memory cell of claim 1, comprising a switching circuit to sequentially switch the world line to the sub-memory cells one after one in each time of programming operation on the memory cell.

4. The nonvolatile memory cell of claim 1, wherein each of the sub-memory cell is controlled by the same word line and the same bit line.

* * * * *